United States Patent [19]

Seki et al.

[11] Patent Number: 4,704,370

[45] Date of Patent: Nov. 3, 1987

[54] SEALING GLASS COMPOSITION

[75] Inventors: Hiroshi Seki, Funabashi; Toshiki Nishiyuki, Chiba, both of Japan

[73] Assignee: Iwaki Glass Company Ltd., Tokyo, Japan

[21] Appl. No.: 548,448

[22] Filed: Nov. 3, 1983

[30] Foreign Application Priority Data

Dec. 3, 1982 [JP] Japan ................................ 57-211256

[51] Int. Cl.$^4$ .......................... C03C 8/24; C03C 14/00
[52] U.S. Cl. ......................................... 501/15; 501/32
[58] Field of Search ..................................... 501/15, 32

[56] References Cited

U.S. PATENT DOCUMENTS

| | | | |
|---|---|---|---|
| 3,951,669 | 4/1976 | Malmendier et al. | 501/15 |
| 3,954,486 | 5/1976 | Francel et al. | 501/15 |
| 4,115,132 | 9/1978 | Suzuki et al. | 501/15 |
| 4,186,023 | 1/1980 | Dumesnil et al. | 501/15 |
| 4,405,722 | 9/1983 | Kokubu et al. | 501/32 |

Primary Examiner—Mark L. Bell
Attorney, Agent, or Firm—Oblon, Fisher, Spivak, McClelland, & Maier

[57] ABSTRACT

A sealing glass composition comprising from 75 to 50% by volume of low-melting glass powder containing PbO as the main component, from 20 to 45% by volume of ceramics powder having a thermal expansion coefficient of at most $30 \times 10^{-7}$ °C.$^{-1}$ in a range of from room temperature to 300° C. and from 5 to 30% by volume of $TiO_2$–$SnO_2$ solid solution powder.

5 Claims, No Drawings

SEALING GLASS COMPOSITION

BACKGROUND OF THE INVENTION

1. Field of the Invention

The present invention relates to a sealing glass composition. More particularly, the present invention relates to a sealing glass compositon which comprises low-melting glass powder, ceramics powder having a low-thermal expansion coefficient and solid solution powder. The sealing glass composition is useful particularly for sealing an alumina package for an electronic component such as a semiconductor integrated circuit (hereinafter referred to simply as "IC").

2. Description of the Prior Art

For the sealing of an alumina package for IC, there has been used a composition comprising low-melting glass powder containing PbO as the major component, and ceramics powder having a low-thermal expansion coefficient, such as zircon, cordierite or lead titanate. However, the sealing compositon containing cordierite or lead titanate as the ceramics powder, has poor sealing strength and is not suitable for sealing a large size package for a large size IC which has become common in recent years as a result of development of highly integrated circuits. On the other hand, the sealing composition containing zircon as the ceramics powder, has adequate sealing strength but it has a drawback such that the impurities contained in zircon emit a substantial amount of $\alpha$-particles, which tend to lead to soft errors of the IC.

SUMMARY OF THE INVENTION

An object of the present invention is to provide a sealing composition for an IC package made of an alumina base sheet, which adequately satisfies various required properties such as an electric property and chemical durability and which at the same time has particularly high sealing strength and low emission of $\alpha$-particles.

The present inventors have found that a sealing composition obtained by mixing $TiO_2$—$SnO_2$ solid solution powder to low-melting glass powder and ceramics powder having a low-thermal expansion coefficient of at most $30 \times 10^{-7}$° C.$^{-1}$ in a range of from room temperature to 300° C., has remarkably high sealing strength and low emission of $\alpha$-particles.

The present invention provides sealing glass composition comprising from 75 to 50% by volume of low-melting glass powder containing PbO as the main component, from 20 to 45% by volume of ceramics powder having a thermal expansion coefficient of at most $30 \times 10^{-7}$° C.$^{-1}$ in a range of from room temperature to 300° C. and from 5 to 30% by volume of $TiO_2$—$SnO_2$ solid solution powder.

DESCRIPTION OF THE PREFERRED EMBODIMENTS

As mentioned above, the sealing glass composition of the present invention has the following composition:
Low-melting glass powder: 75–50% by volume
Ceramics powder having low thermal expansion coefficient: 20–45% by volume
$TiO_2$—$SnO_2$ solid solution powder: 5–30% by volume.

If the amount of the low-melting glass powder is greater than 75% by volume, the thermal expansion of the sealing composition tends to be too great, whereby the thermal expansion will not be compatible with that of alumia. On the other hand, if the amount of the glass powder is less than 50% by volume, the flow characteristics of the sealing composition at the time of sealing operation tend to be deteriorated, whereby hermetic sealing of the packge cannot be accomplished.

It is preferred that the glass powder of this invention have the following composition:
PbO: 77–86% by weight
$B_2O_3$: 6.0–15% by weight
ZnO: 0.5–6.9% by weight
$SiO_2$: 0.1–3.0% by weight.

If the PbO content is less than 77% by weight, the temperature for the sealing operation tends to be too high. On the other hand, if the PbO content exceeds 86% by weight, the thermal expansion coefficient of the composition tends to be too high, whereby the thermal expansion of the composition will not be compatible with that of the alumina package.

If the $B_2O_3$ content is less than 6% by weight, the devitrification is likely to take place during the melting operation of the glass. On the other hand, if the $B_2O_3$ content exceeds 15% by weight, the temperature for the sealing operation tends to be too high.

If the ZnO content is less than 0.5% by weight, the temperature for the sealing opertation tends to be too high. On the other hand, if the ZnO content exceeds 6.9% by weight, the devitrification is likely to take place during the melting operation of the glass.

If the $SiO_2$ content is less than 0.1% by weight, the flow characteristics of the composition tend to deteriorate. On the other hand, if the $SiO_2$ content exceeds 3% by weight, the temperature for the sealing operation tends to be too high.

In addition to the above-mentioned essential ingredients, there may be incorporated up to 3% by weight of $Al_2O_3$, upto 1.5% by weight of $SnO_2$ and/or up to 2% of at least one oxide selected from the group consisting of BaO, SrO, CaO and MgO to control the devitrification.

Further, by the addition of upto 1% of $Li_2O$, $Na_2O$ or $K_2O$, it is possible to lower the temperature for the sealing operation.

The low-melting glass powder preferably has a glass transition point of not higher than 335° C.

The ceramics powder to be used in the present invention has a thermal expansion coefficient of not higher than $30 \times 10^{-7}$° C.$^{-1}$ within a temperature range of from room temperature to 300° C. If the thermal expansion coefficient exceeds $30 \times 10^{-7}$° C.$^{-1}$, the thermal expansion of the sealing glass composition tends to be hardly compatible with the thermal expansion of alumina.

If the amount of this ceramics powder exceeds 50% by volume, the flow characteristics of the sealing compositon at the time of the sealing operation tend to deteriorate, whereby hermetic sealing of the package can hardly be obtained. If the amount of the ceramics powder is less than 20% by volume, the thermal expansion coefficient of the sealing glass compositon tends to be too great, whereby the thermal expansion of the composition will be hardly compatible with that of alumina.

If the amount of the $TiO_2$—$SnO_2$ solid solution powder is greater than 30% by volume, the flow characteristics of the sealing compositon tend to be deteriorate or the thermal expansion coefficient of the sealing composition tends to be too high. On the other hand, if the amount of the TiO$_2$—SnO$_2$ solid solution powder is less than 5% by volume, the strength will be poor, whereby the object of the present invention cannot be accomplished.

The TiO$_2$—SnO$_2$ solid solution should preferably contain at least 5 molar% of TiO$_2$ to maintain the electric insulation property and should also preferably contain at least 50 molar%, of SnO$_2$ to maintain the low-dielectric constant.

As the ceramics powder having a low thermal expansion coefficient, there may be employed, for instance, β-eucryptite, petalite, β-spodumen, lead titanate, silica glass or cordierite. Among them, cordierite is particularly preferred as the ceramics powder since it has excellent chemical durability and electric insulation property, and its dielectric constant is small.

The sealing glass compostion of the present invention preferably has the following composition:

Low-melting glass powder: 70–53% by volume
Cordierite: 25–37% by volume
TiO$_2$—SnO$_2$ solid solution: 5–20% by volume,
wherein the TiO$_2$—SnO$_2$ solid solution powder is composed essentially of from 5 to 50 molar% of TiO$_2$ and from 50 to 95 molar% of SnO$_2$.

A method for preparing of the sealing glass composition of the present invention will be described.

The low-melting glass powder may be prepared by mixing predetermined amounts of lead oxide powder, boric acid powder, zinc oxide powder and silica powder, then melting the mixture at 1100° C. for one hour, and pulverizing glass cullet thereby obtained, followed by classification to obtain a powder having a particle size of at most 150 mesh.

The ceramics powder having a low thermal expansion coefficient may be prepared by mixing starting material powders in stoichiometric amounts to constitute the ceramics having the predetermined low thermal expansion coefficient, then burning the mixture for at least ten hours at a temperature sufficient to form the ceramics, and pulverizing the ceramics into a powder having a particle size of at most 150 mesh.

The TiO$_2$—SnO$_2$ solid solution powder may be prepared by mixing predetermined amounts of TiO$_2$ powder and SnO$_2$ powder and burning the mixture at a high temperature of at least 1000° C. The product thereby obtained is further pulverized into a powder having a particle size of at most 150 mesh.

The true specific gravity of each powder thus obtained is measured. Then, the powders are mixed in the respective predetermined proportions, and the mixture is thoroughly mixed by a V-mixer to obtain a sealing glass composition of the present invention.

The present invention will now be described in further detail with reference to an Example. However, it should be understood that the present invention is by no means restricted to this specific Example.

EXAMPLE

Nine samples were prepared wherein the proportions of the low-melting glass powder, the ceramics powder having a low thermal expansion coefficient and the TiO$_2$—SnO$_2$ solid solution powder were varied as shown in Table 1. Various properties of these samples were measured. The results thereby obtained are shown in Table 1. For the purpose of comparison, the properties of two conventional products were also measured, and the results are shown in Table 1.

The low-melting glass powder used in this Example comprised 84% by weight of PbO, 12% by weight of B$_2$O$_3$, 2.5% by weight of ZnO, 1.0% by weight of SiO$_2$ and 0.5% by weight of Al$_2$O$_3$, and it had a glass transition point of 310° C. as measured as the starting point of initial endothermic reaction which apears on the DTA thermogram. The TiO$_2$—SnO$_2$ solid solution powder used in this Example had a composition as shown in Table 2.

TABLE 1

| | | | Sample Nos. | | | | |
|---|---|---|---|---|---|---|---|
| | | 1 | 2 | 3 | 4 | 5 | 6 |
| Low-melting glass powder (% by volume) | | 58 | 62 | 59 | 53 | 55 | 50 |
| Ceramic powder of low thermal expansion coefficient | Material | Cordierite | Cordierite | Cordierite | Cordierite | Cordierite | Petalite |
| | % by volume | 37 | 30 | 29 | 31 | 25 | 20 |
| TiO$_2$—SnO$_2$ solid solution powder | Composition (Table 2) | B | A | B | C | D | B |
| | % by volume | 5 | 8 | 12 | 16 | 20 | 30 |
| Thermal expansion coefficient ($\times 10^{-7}$/°C.) | | 66 | 67 | 68 | 66 | 68 | 69 |
| Sealing operation temperature (°C.) | | 430 | 430 | 430 | 450 | 440 | 450 |
| Flow characteristics (mm) | | 21.2 | 21.4 | 21.0 | 21.0 | 21.0 | 20.8 |
| Dielectric constant 25° C. 1 MHZ | | 12.7 | 12.7 | 13.0 | 13.2 | 13.8 | 13.8 |
| Amount of emission of α-particles (count/hr) | | 1.0 | 1.2 | 1.1 | 1.3 | 1.3 | 1.3 |
| Sealing strength (kgcm) | Average | 59 | 65 | 71 | 75 | 74 | 78 |
| | Minimum | 48 | 50 | 53 | 58 | 55 | 60 |
| Chemical durability | | Good | Good | Good | Good | Good | Slightly inferior |

| | | Sample Nos. | | | Conventional product A | Conventional product B |
|---|---|---|---|---|---|---|
| | | 7 | 8 | 9 | | |
| Low-melting glass powder (% by volume) | | 50 | 54 | 75 | 64 | 55 |
| Ceramics powder of low thermal | Material | Lead titanate | β-Spodumen | β-Eucryptite | Cordierite | Lead titanate + Zircon |

TABLE 1-continued

| | | | | | | |
|---|---|---|---|---|---|---|
| expansion coefficient | % by volume | 45 | 30 | 20 | 36 | 45 |
| $TiO_2$—$SnO_2$ solid solution powder | Composition (Table 2) | B | C | C | — | — |
| | % by volume | 5 | 16 | 5 | — | — |
| Thermal expansion coefficient ($\times 10^{-7}$/°C.) | | 64 | 66 | 72 | 68 | 66 |
| Sealing operation temperature (°C.) | | 450 | 450 | 430 | 430 | 450 |
| Flow characteristics (mm) | | 20.3 | 20.6 | 22.0 | 21.5 | 21.0 |
| Dielectric constant 25° C. 1 MHZ | | 31.5 | 13.2 | 12.5 | 12.5 | 30.0 |
| Amount of emission of α-particles (count/hr) | | 1.5 | 1.3 | 1.1 | 1.0 | 31.5 |
| Sealing strength (kgcm) | Average | 75 | 72 | 55 | 53 | 70 |
| | Minimum | 56 | 57 | 45 | 42 | 51 |
| Chemical durability | | Good | Slightly inferior | Slightly inferior | Good | Good |

TABLE 2

| Composition of $TiO_2$—$SnO_2$ solid solution (molar %) | | | | |
|---|---|---|---|---|
| | A | B | C | D |
| $TiO_2$ | 5 | 20 | 33 | 50 |
| $SnO_2$ | 95 | 80 | 67 | 50 |

It is evident from Table 1 that the sealing glass compositions of the present invention have extremely small emission of α-particles and high sealing strength, and their other properties are equivalent or superior to those of the conventional products.

The methods for the measurements of various properties and the preferred ranges of the respective values are as follows.

The thermal expansion coefficient should be compatible with that of alumina and should preferably be within a range of from 60 to $75 \times 10^{-7}$° C.$^{-1}$.

The measuring methods for the properties given in Table 1 will be described.

For the measurement of the flow characteristics, each powder sample was taken in a gram amount corresponding to its specific gravity and press-molded into a cylinder having a diameter of 12.7 mm, which is then placed on a glass sheet and maintained at the sealing operation temperature shown in Table 1 for 10 minutes. After cooling, the diameter of the flowed sample was measured. The measured value was taken to represent the flow characteristics. If this diameter is at least 20 mm, the sealing can be adequately done at the sealing operation temperature shown in Table 1.

The dielectric constant was measured at 25° C. under 1 MHZ. This value should desirably be at most 14 for a sealing glass composition for a high speed IC.

The amount of emission of α-particles was determined by counting the number of α-particles emitted in a vacuum condition by means of a scintillation counter. This value should desirably be at most 1.5 count/cm$^2$.hr.

The sealing strength was measured in accordance with the torque strength measuring method of U.S. Military Specifications and Standards (MIL-STD883B-2024). This method was conducted in such a manner that firstly an IC package comprising an alumina base sheet (16 pin SSI type) and a 42-Ni-Fe alloy was hermetically sealed with the sealing glass composition shown in Table 1, whereupon the torque breaking strength of the sealing portion was measured. The measured values in Table 1 represent the average values and the minimum values with respect to 20 samples in each case.

The chemical durability was determined on the basis of whether or not, when a Sn plating was applied to the package, the sealing glass composition was eroded by the plating electrolyte and consequently a plating bridge was formed.

What is claimed is:

1. A sealing glass composition consisting of from 75 to 50% by volume of low-melting glass powder containing PbO as the main component; from 20 to 45% by volume of ceramics powder having a thermal expansion coefficient of at most $30 \times 10^{-7}$° C.$^{-1}$ in a range of from room temperature to 300° C. and from 5 to 30% by volume of $TiO_2$—$SnO_2$ solid solution powder; wherein said solid solution powder comprises from 5 to 50 molar % of $TiO_2$ and from 50 to 95 molar % of $SnO_2$.

2. The sealing glass composition acording to claim 1, wherein said ceramics powder is made of cordierite.

3. The sealing glass composition according to claim 2, which comprises from 70 to 53% by volume of the low-melting glass powder, from 25 to 35% by volume of the cordierite powder and from 5 to 20% by volume of the $TiO_2$—$SnO_2$ solid solution powder.

4. The sealing glass composition according to claim 1, wherein the low-melting glass powder has a glass transition point of not higher than 335° C.

5. The sealing glass composition according to claim 1, wherein the low-melting glass powder is composed essentially of from 77 to 86% by weight of PbO, from 6.0 to 15% by weight of $B_2O_3$, from 0.5 to 6.9% by weight of ZnO and from 0.1 to 3.0% by weight of $SiO_2$.

* * * * *